(12) United States Patent
Cheng (10) Patent No.: US 6,909,610 B2
(45) Date of Patent: Jun. 21, 2005

(54) SLIDING TRACK OF INDUSTRIAL COMPUTER

(76) Inventor: Chi-Tsun Cheng, 235 Chung-Ho Box 8-24, Taipei (TW)

( * ) Notice: Subject to any disclaimer, the term of this patent is extended or adjusted under 35 U.S.C. 154(b) by 147 days.

(21) Appl. No.: 10/446,428

(22) Filed: May 29, 2003

(65) Prior Publication Data

US 2004/0240185 A1 Dec. 2, 2004

(51) Int. Cl.$^7$ ................................................ H05K 1/16
(52) U.S. Cl. .............. 361/727; 312/334.11; 312/334.33
(58) Field of Search ................................. 361/724–727; 312/223.1, 334.11, 334.15, 334.17, 334.25, 334.26, 334.33, 334.38

(56) References Cited

U.S. PATENT DOCUMENTS

| | | | | |
|---|---|---|---|---|
| 4,921,359 A | * | 5/1990 | Sakamoto | 312/334.17 |
| 5,248,195 A | * | 9/1993 | Shin | 312/334.33 |
| 5,992,956 A | * | 11/1999 | Slivon | 312/334.25 |
| 6,021,047 A | * | 2/2000 | Lopez et al. | 361/727 |
| 6,076,906 A | * | 6/2000 | Royal | 312/223.1 |
| 6,145,944 A | * | 11/2000 | Bayani et al. | 312/334.44 |
| 6,201,702 B1 | * | 3/2001 | Schmitt | 361/725 |
| 6,379,045 B1 | * | 4/2002 | Cirocco | 312/334.11 |
| 6,585,335 B2 | * | 7/2003 | Hwang et al. | 312/333 |

* cited by examiner

Primary Examiner—Lisa Lea-Edmonds (57) ABSTRACT

A sliding track of an industrial computer comprises at least one tracking strip base being a straight long frame; an inner side of the tracking strip being formed with an axial slot; at least one tracking strip being positioned in the slot; a groove being formed between each of the two ends of the tracking strip and one side of the slot; a plurality of beads being received in the grooves, but a part of each outside bead protruding out of the groove and resisting against a cambered trench within the slot so that the beads will not fall out. The tracking strip is inserted into the tracking strip base. The beads is confined by and rolls in the grooves and thus the tracking strips slide in the tracking strip bases.

6 Claims, 9 Drawing Sheets

SLIDING TRACK OF INDUSTRIAL COMPUTER

FIELD OF THE INVENTION

The present invention relates to industrial computers, and particularly to a sliding track of an industrial computer.

BACKGROUND OF THE INVENTION

Figure 1:
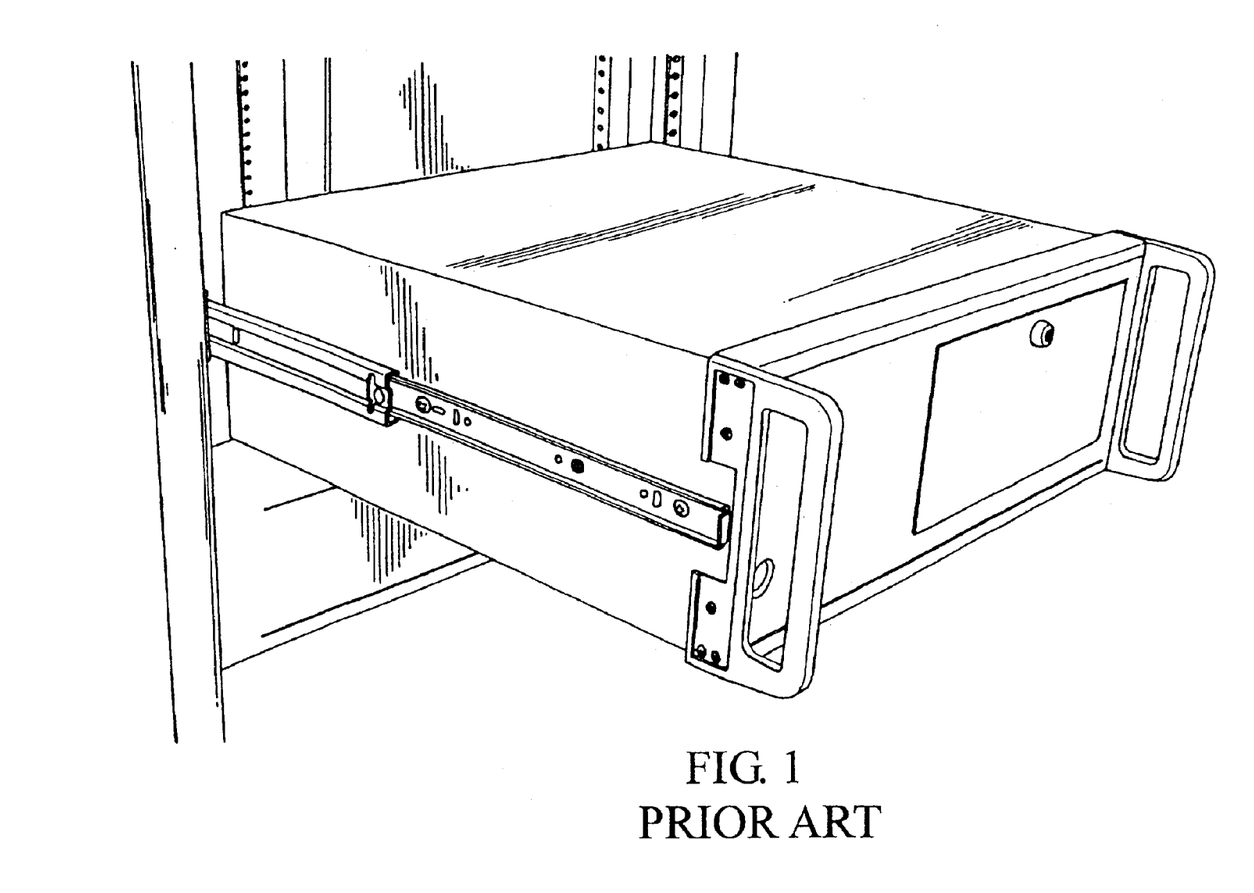
FIG. 1 is a schematic view of a prior art sliding track.

With reference to FIG. 1, a multi-sheet sliding track used in a computer keyboard or an industrial computer is illustrated. The track is wide and occupies a large area. The assembly work is tedious and thus cost is high.

Figure 2:
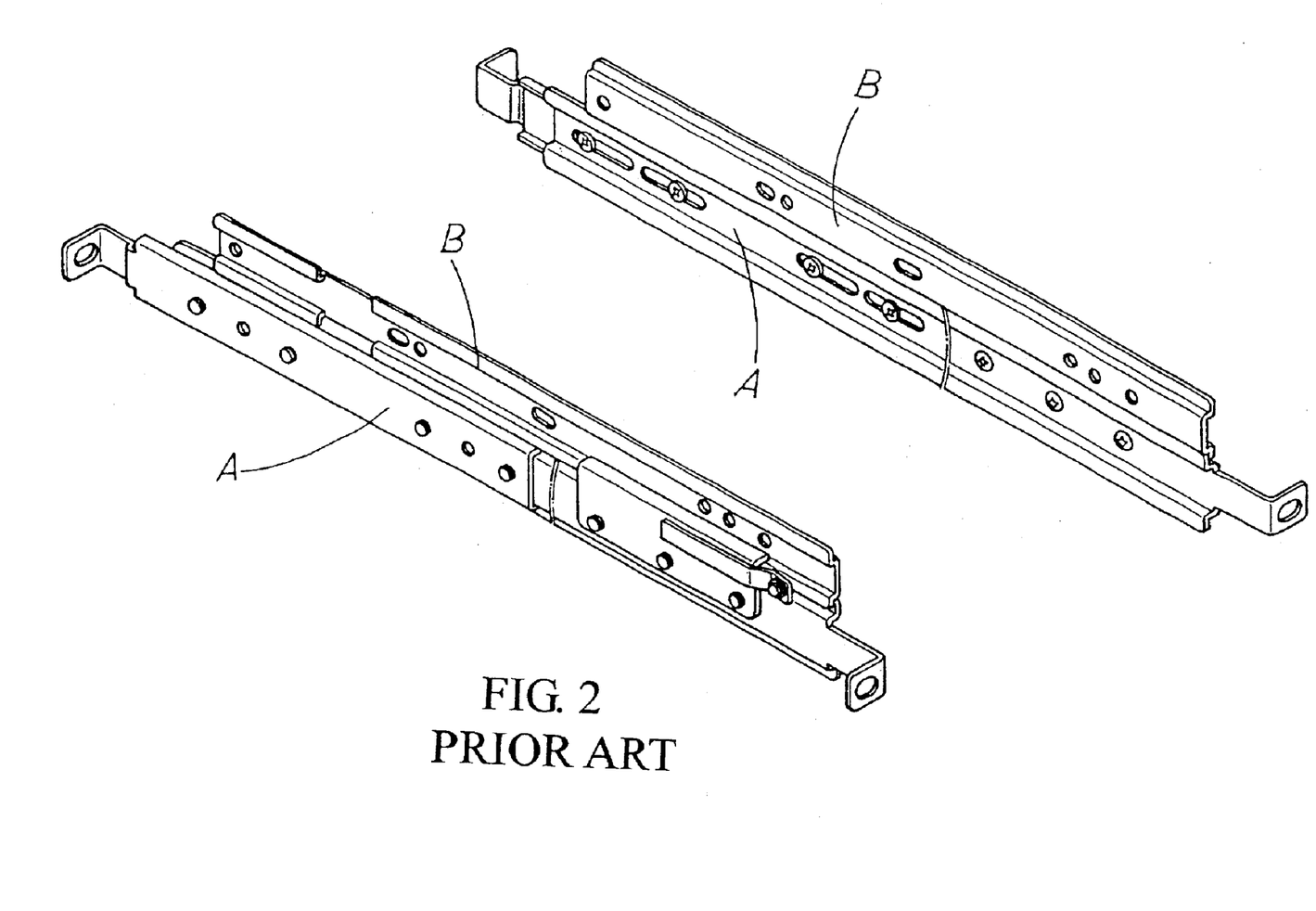
FIG. 2 is a schematic view of another prior art sliding track.
Figure 3:
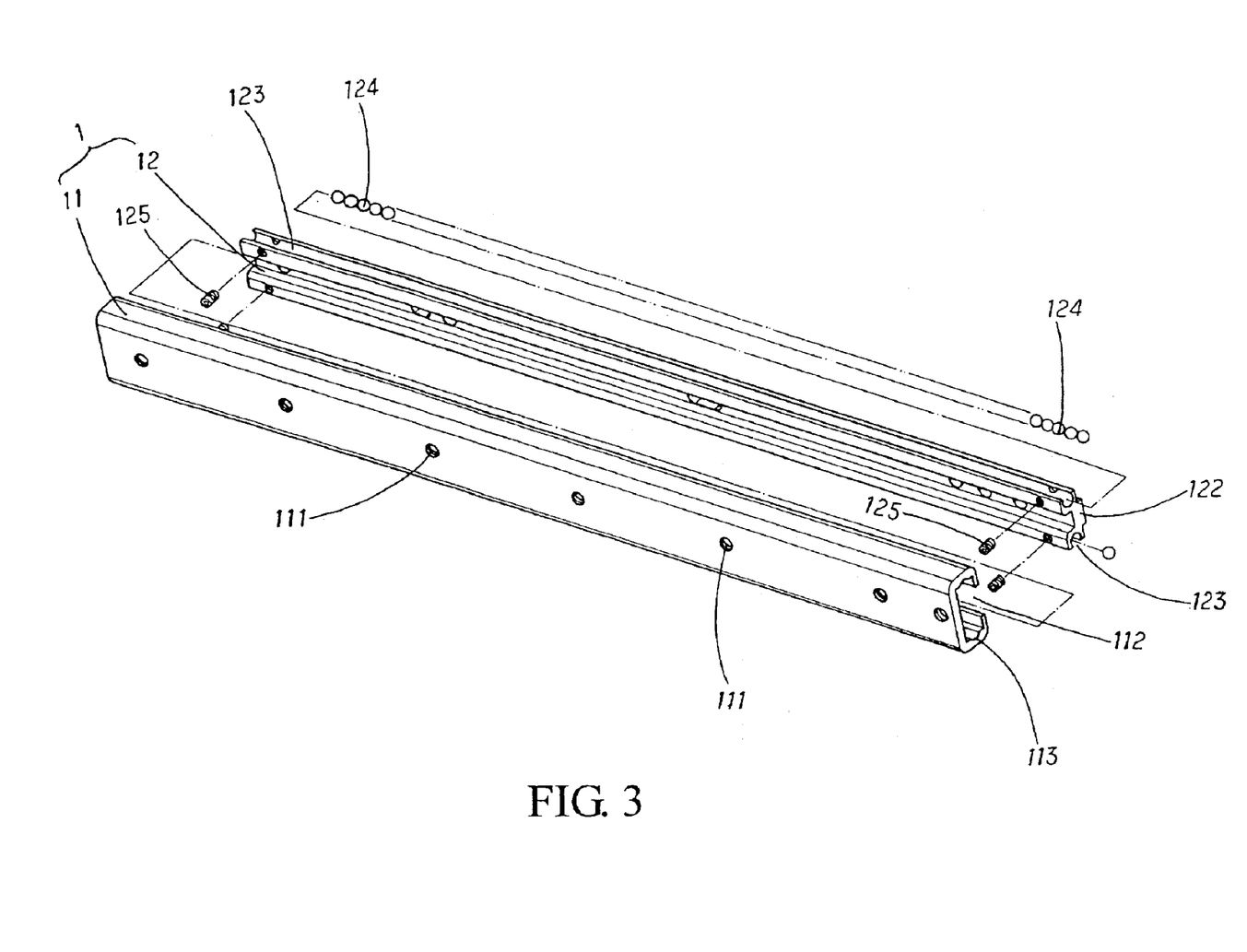
FIG. 3 is an exploded perspective view of the present invention.
Figure 4:
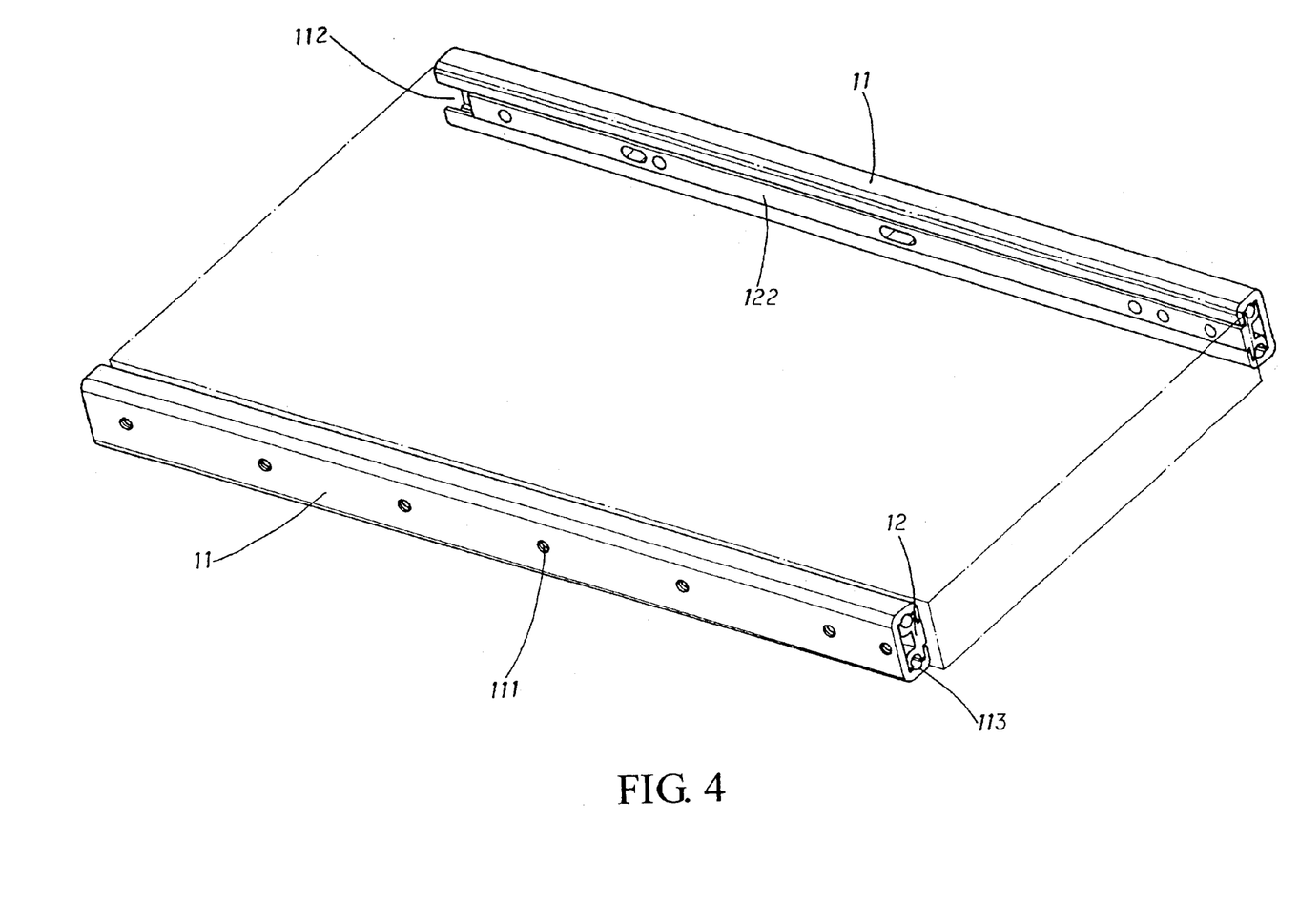
FIG. 4 is an assembled perspective view of the present invention.

Referring to FIG. 2, another simple structure for the sliding tracks is illustrated, which can improve the defects in the prior art. From FIG. 2, it is shown that the base A and the slide sheet B are integrally formed by punching many times and thus the manufacturing process is tedious. Moreover, to make a 90 degree bending angle is very difficult. Thereby, the sliding track can not be firmly secured to the base A. Thus, the sliding effect is bad. Moreover, since the computer keyboards and industrial computers are heavy and thus they can not move smoothly.

SUMMARY OF THE INVENTION

Accordingly, the primary object of the present invention is to provide a sliding track of an industrial computer which comprises at least one tracking strip base being a straight long frame; an inner side of the tracking strip being formed with an axial slot; at least one tracking strip being positioned in the slot; a groove being formed between each of the two ends of the tracking strip and one side of the slot; a plurality of beads being received in the grooves, but a part of each outside bead protruding out of the groove and resisting against a cambered trench within the slot so that the beads will not fall out. The tracking strip is inserted into the tracking strip base. The beads are confined by and roll in the grooves and thus the tracking strips slide in the tracking strip bases.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 5:
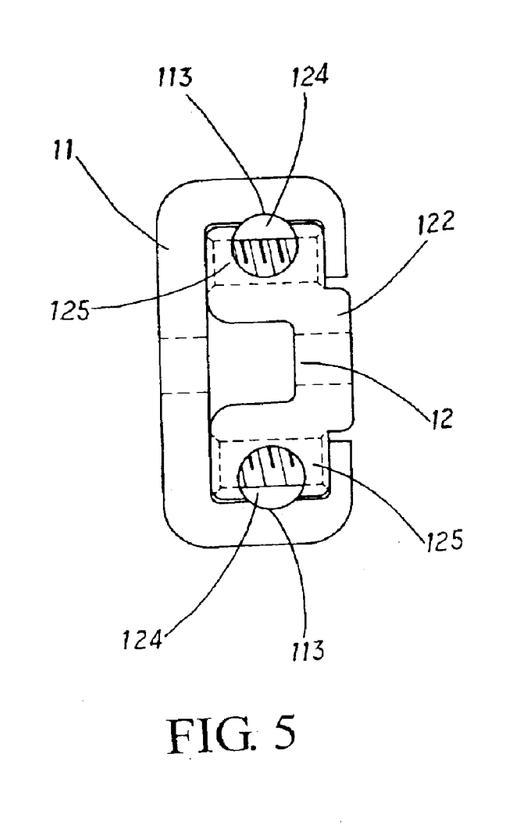
FIG. 5 is a schematic cross sectional view of the present invention.
Figure 6:
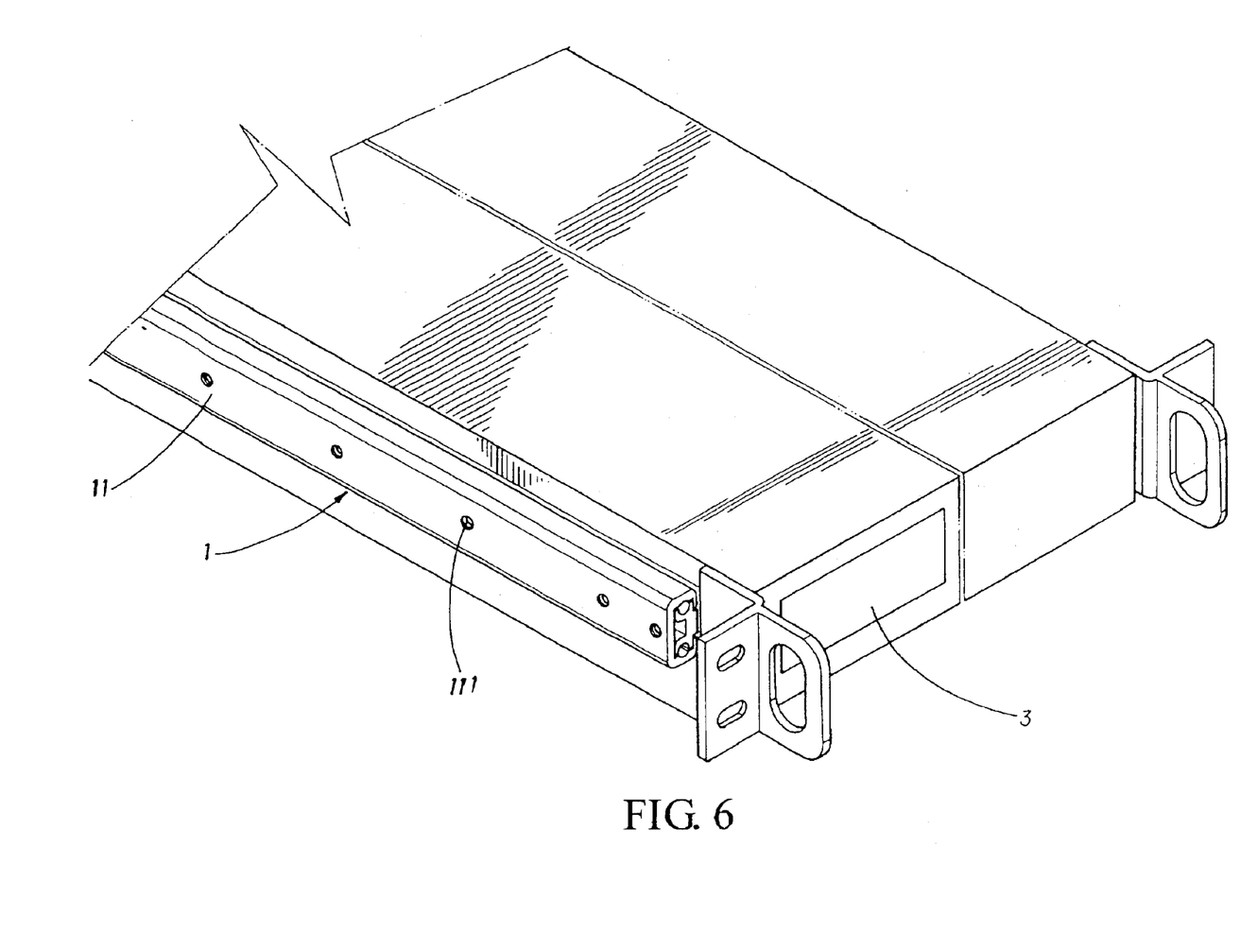
FIG. 6 shows an application of the present invention.
Figure 7:
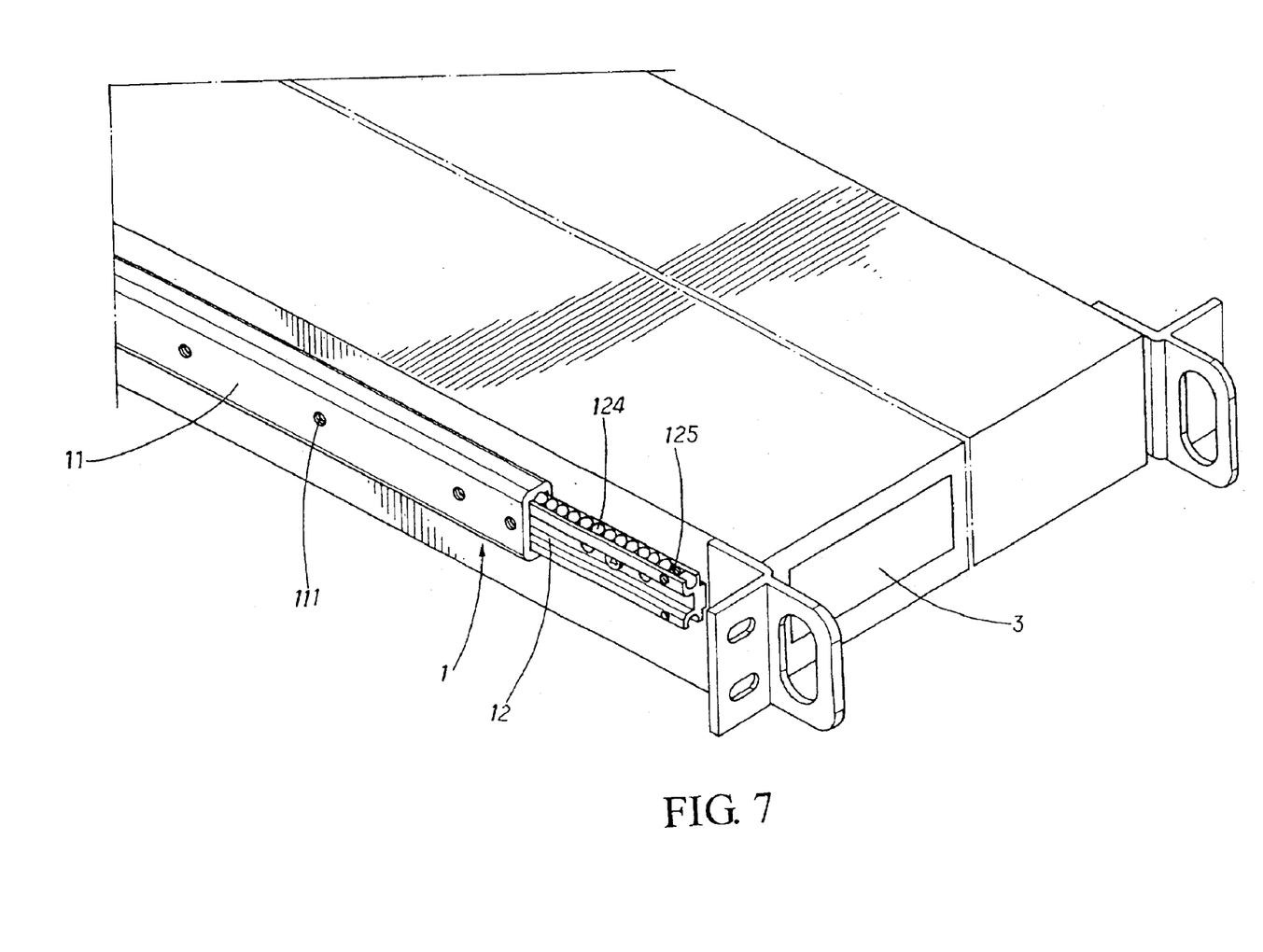
FIG. 7 is a schematic view of the present invention.

Referring to FIG. 3–6, the sliding track of an industrial computer of the present invention is illustrated. The tracks 1 are installed at two inner sides of an industrial computer casing 2. Each track 1 includes at least one tracking strip base 11 and a tracking strip 12. The tracking strip base 11 is a straight long frame. An outer wall of the tracking strip base 11 has a plurality of axial holes 111. The tracking strip base 11 is screwedly fixed to the casing 2 through the axial holes 111. An inner side of the tracking strip 12 is formed with an axial slot 112. The tracking strip 12 is positioned in the slot 112. The tracking strip 12 is formed with a protrusion 122. In assembly, the protrusion 122 is positioned outside the slot 112 so as to lock to a computer mainframe 3 or other computer peripherals. A groove 123 is formed between each of the two ends of the tracking strip 12 and one side of the slot 112. A plurality of beads 124 are received in the grooves 123. With reference to FIG. 5, each end of the groove 123 is sealed by a plug 125 for confining the beads 124, but a part of each outside bead 124 protrudes out of the groove 123 and resists against a cambered trench 113 within the slot 112. Thereby, the beads 124 will not fall out. When the tracking strip 12 is inserted into the tracking strip base 11, the protrusion 122 exactly passes through and slide along the slot 112. The beads 124 are confined by and roll in the grooves 123 and thus the tracking strips 12 slide in the tracking strip bases 11.

Figure 8:
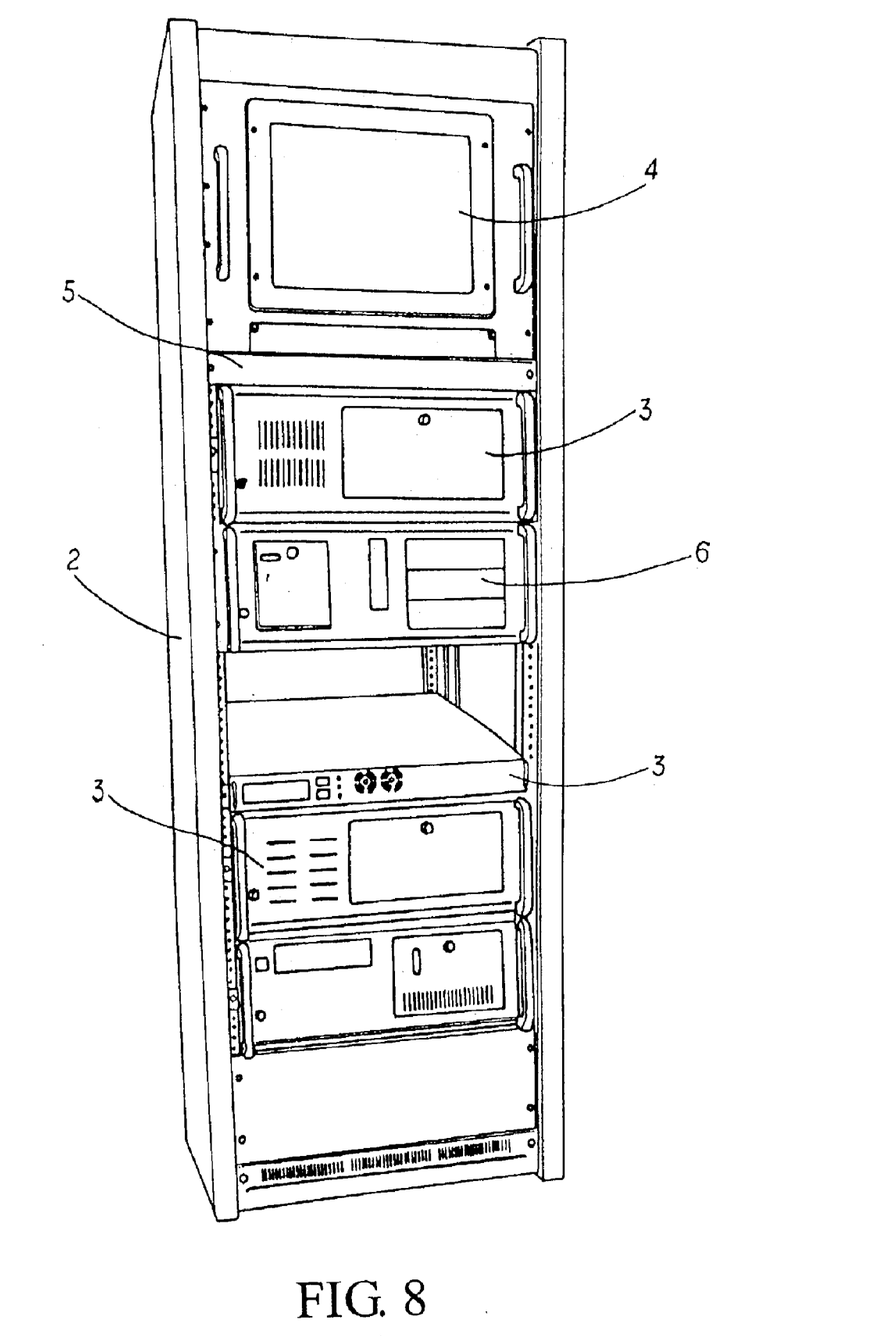
FIG. 8 shows one embodiment of the present invention, where the present invention is provided to a computer mainframe and peripherals.

By above components, the tracking strip bases 11 are installed at two inner sides of the casing 2. Then a computer mainframe 3 (or other peripherals, such as a screen 4, a keyboard 5, a disk array 6, etc.) with tracking strips 12 at two sides are inserted into the casing 2, as shown in FIG. 8, so that the beads 124 in, the upper and lower ends of the tracking strips 12 resist against the cambered trenches 113. Then this computer mainframe 3 or other peripheral devices are placed across and slides along the tracking strip bases 11 by the tracking strips 12.

Figure 9:
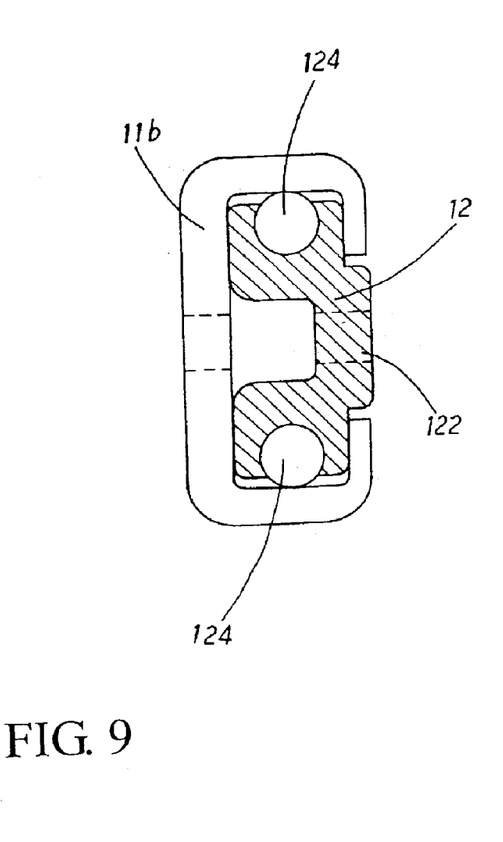
FIG. 9 is a cross sectional view showing another embodiment of the present invention about the tracking strip base of the present invention.

Referring, to FIGS. 5 and 9, it is illustrated that the cambered trench 113 is axially formed within the tracking strip base 11. When the tracking strip 12 passes through the tracking strip base 11, the cambered trench 113 can resist and position the beads 124 with a preferred effect.

In practical use, the tracking strip base 11a, 11b, can adjust the contact area of the beads 124 and cambered trench 113, 113a, even the cambered trench 113 can not be used. Since the beads 124 resist against the tracking strip base 11 so as to have a stress therebetween and the conformity of the beads 124 and the tracking strip base 11 is adjustable, the beads 124 will be retarded when they rolls in the groove 123. Thereby, the tracking strip 12 is damped when it slides in the tracking strip base 11.

Figure 10:
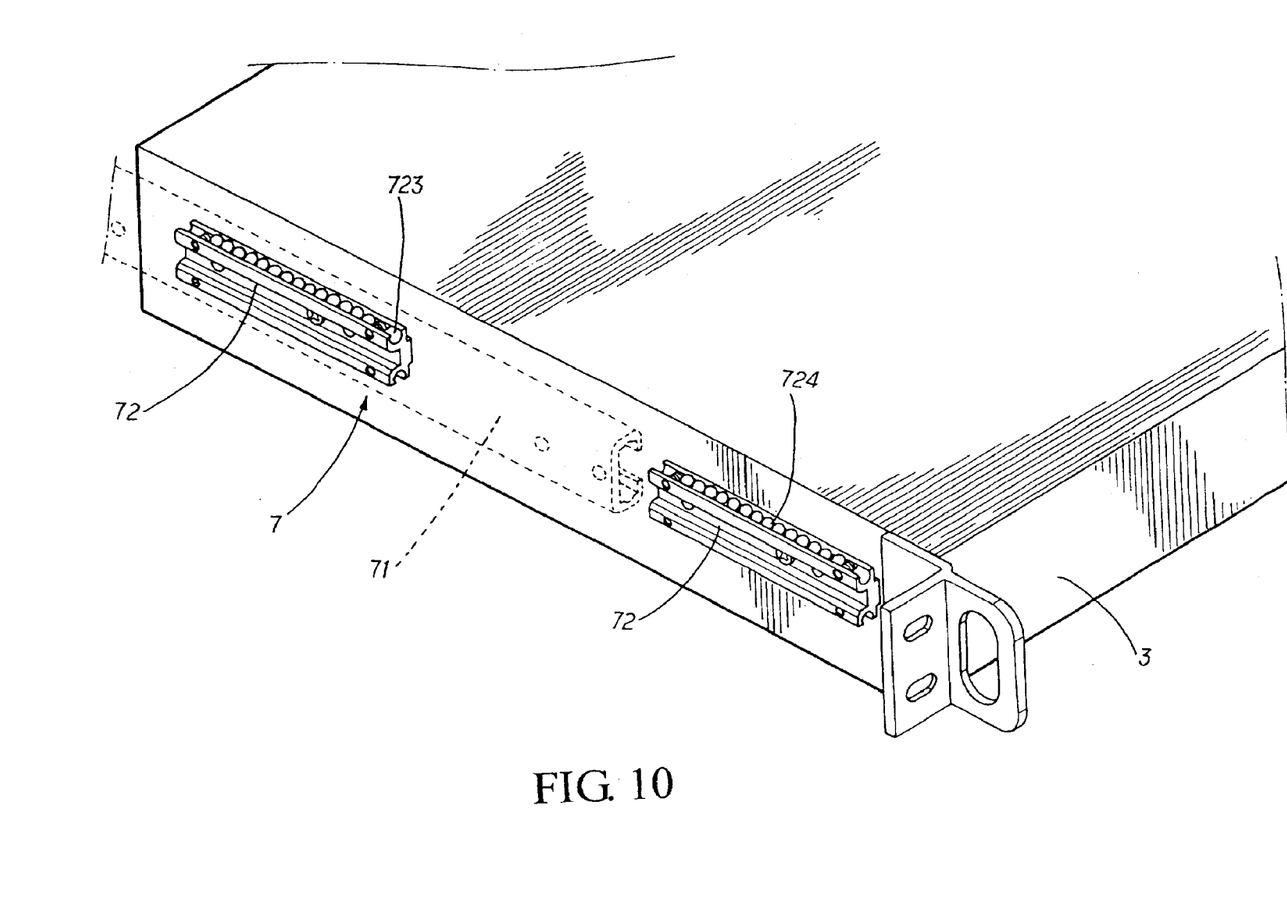
FIG. 10 shows yet an embodiment of the present invention, wherein the present invention is used in the installation of a computer mainframe.

With reference to FIG. 10, another embodiment of the present invention is illustrated. It is illustrated that the track 7 includes tracking strip bases 71 and tracking strips 72. The tracking strips 12 are installed at a front end and rear end of a computer mainframe 3. The tracking strips 72 are inserted into and roll in the tracking strip bases 71 by the beads 724 in the groove 723.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A sliding track of an industrial computer comprising: at least one tracking strip base being a straight long frame; an inner side of the tracking strip base being formed with an axial slot; at least one tracking strip being positioned in the axial slot; groove being formed between each of the two ends of the tracking strip and one side of the axial slot, a plurality of beads being received in the grooves, but a part of each outside bead protruding out of the groove and resisting against a cambered trench within the axial slot so that the beads will not fall out; wherein the tracking strip is inserted into the tracking strip base, the beads is confined by and rolls in the grooves and thus the tracking strips slide in the tracking strip bases.

2. The sliding track of an industrial computer as claimed in claim 1, wherein the tracking strip is formed with a protrusion and is positioned outside the slot so as to lock to a computer mainframe or a computer peripheral device.

3. The sliding track of an industrial computer as claimed in claim 1, wherein each end of the groove is sealed by a plug for confining the beads.

4. The sliding track of an industrial computer as claimed in claim 1, wherein a cambered trench is axially formed within the tracking strip base; when the tracking strip passes through the tracking strip base, the cambered trench resists and positions the beads.

5. The sliding track of an industrial computer as claimed in claim 1, wherein the beads resist against the tracking strip base so as to have a stress therebetween and the conformity of the beads and the tracking strip base is adjustable, the beads will be retarded when they roll in the groove; thereby, the tracking strip is damped when it slides in the tracking strip base.

6. The sliding track of an industrial computer as claimed in claim 1, wherein an outer wall of the tracking strip base has a plurality of axial holes; and the tracking strip base is fixed to a casing by screwing screws into the axial holes.

* * * * *